US005637840A

United States Patent [19]

Kim

[11] Patent Number: 5,637,840

[45] Date of Patent: Jun. 10, 1997

[54] MINIATURIZED HIGH POWER SPEAKER

[75] Inventor: Jae H. Kim, Buchun, Rep. of Korea

[73] Assignee: K & J Electronics, Inc., Buchun, Rep. of Korea

[21] Appl. No.: 332,881

[22] Filed: Nov. 1, 1994

[30] Foreign Application Priority Data

Mar. 2, 1994 [KR] Rep. of Korea .......................... 135080

[51] Int. Cl.[6] .......................................... H05K 5/00

[52] U.S. Cl. .......................................... 181/152; 181/155

[58] Field of Search .......................... 181/152, 155, 181/156, 182, 188, 194, 149, 150; 381/156, 159, 160, 154

[56] References Cited

U.S. PATENT DOCUMENTS

| | | | |
|---|---|---|---|
| 2,058,555 | 10/1936 | Betts et al. | 181/152 |
| 3,432,002 | 3/1969 | Cohen | 181/152 |
| 4,965,837 | 10/1990 | Murayama et al. | 381/186 |
| 5,359,158 | 10/1994 | Queen | 181/150 |

*Primary Examiner*—Khanh Dang

[57] ABSTRACT

A thin, compact, high power speaker for producing high volume sound alarm signals and for reproducing voice messages, and which may be installed in a limited space. The speaker of the invention includes a housing, a transducer mounted in the housing for generating sound signals, a high pressure chamber acoustically coupled to the transducer for receiving and compressing the sound signals from the transducer, a nozzle acoustically coupled to the high pressure chamber, a sound resonance/reflection passage acoustically coupled to the nozzle to amplify and reflect the sound signals, and a sound induction passage acoustically coupled to the resonance/reflection passage to direct the amplified and reflected sound signals through the front of the speaker into the surrounding space.

4 Claims, 4 Drawing Sheets

MINIATURIZED HIGH POWER SPEAKER

BACKGROUND OF THE INVENTION

The invention relates to a thin compact high power speaker for use in audio and/or alarm systems, and which is intended to replace the present-day bulky prior art speakers.

The prior art speakers are of two general types, one type includes an elongated trumpet horn which amplifies sound signals from a transducer and directs the sound signals along a linear path; and the other prior art type reflects and amplifies the sound signals from the transducer in a tortuous path in order to conserve space. The two types of prior art speakers are difficult to miniaturize, and they are of an awkward shape and size which renders them generally unsuitable for indoor use insofar as alarm systems are concerned.

Compact speakers using piezo crystal oscillators are also known to the prior art. However, such prior art speakers have limited response in the high frequency range and are incapable of reproducing the human voice with any degree of fidelity. As a result, the piezo crystal oscillator prior art speaker is only useful in producing alarm signals of certain limited frequencies, and it is not suitable for reproducing the human voice with any degree of quality.

The speaker of the present invention, on the other hand, is compact and light-weight, and it may be installed in a limited space which makes it suitable for indoor use in conjunction with alarm systems. The speaker of the invention is capable of producing alarm signals as well as voice signals with a level of volume and quality required in present day alarm and audio systems. Specifically, the speaker of the invention exhibits a frequency response suitable for the reproduction of high quality voice signals, as well as sound alarm signals.

SUMMARY OF THE INVENTION

The invention provides a thin and compact high power speaker for producing high volume sound alarm signals as well as voice signals. The compact speaker of the invention has a feature in that it may be installed in a limited space. The compact speaker of the invention in the embodiments to be described includes a housing, a transducer mounted in the housing for generating sound signals in response to applied electrical audio signals, a high-pressure chamber acoustically coupled to the transducer for compressing the sound signals from the transducer, a high-pressure sound radiation nozzle coupled to the high-pressure chamber, a sound resonance/reflection passage acoustically coupled to the nozzle which amplifies the sound signals from the nozzle and reverses the path of the sound signals, and a relatively short trumpet coupled to the resonance/reflection passage which radiates the amplified and reversed sound signals from the front of the speaker into the surrounding space with high volume and good quality.

DETAILED DESCRIPTION OF THE ILLUSTRATED EMBODIMENTS

The subject invention is directed to a thin, compact, light-weight, high-power speaker which may be installed internally or externally in a limited space for use in voice reproduction or alarm systems. The speaker of the invention compresses sounds originating from the transducer in a high-pressure chamber and then passes the sound signals through a nozzle to a resonance/reflection path which amplifies the sound·signals, reverses their path, and directs the amplified signals to a relatively short trumpet path for further amplification, causing the speaker to produce high volume, wide range and good quality sound signals.

Figure 1:
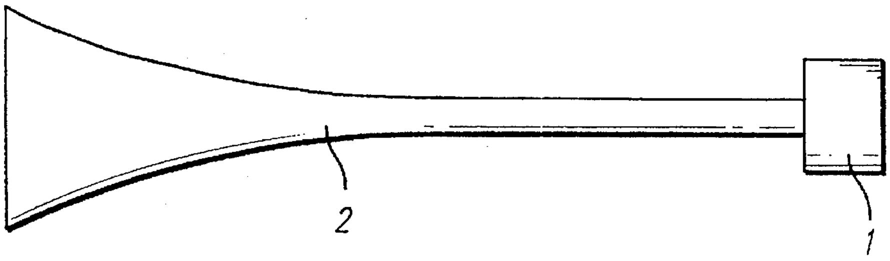
FIG. 1 PRIOR ART
FIG. 1 is a schematic diagram of a prior art trumpet speaker.
Figure 2:
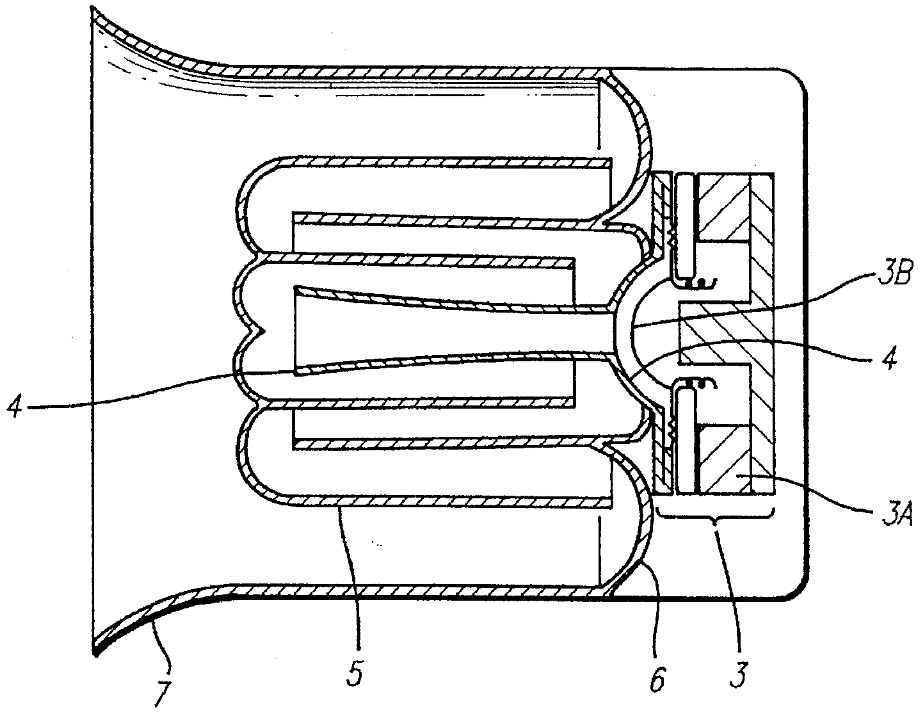
FIG. 2 PRIOR ART
FIG. 2 is a sectional view of a prior art reflection speaker.

The usual prior art speakers can be classified generally as the two types shown in FIGS. 1 and 2 respectively. The first type shown in FIG. 1 is equipped with a relatively long trumpet horn 2 and a transducer 1. Transducer 1 converts electrical audio signals into sound signals which are passed in a linear direction through the horn 2 for amplification so that they may be emitted at relatively high volume from the mouth of the horn. The general configuration of the prior art reflection type speaker, such as shown in FIG. 2, is such that the output sound signals from the transducer are amplified and reflected in tortuous path, so as to reduce the overall length of the speaker as compared with the horn speaker of FIG. 1.

In the prior art speaker of FIG. 1, the transducer 1 converts electrical audio signals into sound signals which are emitted into space after amplification through the trumpet horn 2. The disadvantages of the type of prior art speaker of FIG. 1 include: (a) poor frequency characteristics; (b) difficulty in reducing the size and weight of the speaker due to the length of the trumpet horn; and (c) limitations relative to the possible installation locations and difficult handling due to the length of its trumpet horn and weight of the speaker. Therefore, the speaker of FIG. 1 is difficult to install in a limited space, and for that reason it is not suitable for incorporation into residential. or vehicle alarm systems due to the length of the trumpet.

In order to solve the disadvantages of the prior art speaker of FIG. 1, the prior art speaker shown in FIG. 2 has been adopted. The latter speaker uses a tortuous sound path for amplifying the sound which effectively shortens the length of the trumpet. The prior art speaker of FIG. 2 consists of a transducer 3, a nozzle 4, a first reflection member 5 consisting of a number of integral coaxial tubular members closed at their forward end, as shown, and shaped to amplify and reverse the direction of the sound from the nozzle 4 back toward the transducer.

The speaker of FIG. 2 also includes a second reflection member 6 which also is shaped to form a plurality of coaxial tubular members which are closed at the opposite end to the tubular members of member 5. Member 6 serves to reflect the sound signals from the tubular members of member 5 back in a direction away from the transducer. The tubes of member 6 are also shaped, like the tubes of member 5, so as to form a smooth path for the sound signals as they are reflected back and forth and finally as they are directed into a shortened trumpet 7.

The transducer 3 converts electric audio signals into sound signals. The nozzle 4 is axially aligned with the center of transducer 3, and it picks up and diffuses the sound signals from the transducer resulting in amplification of the sound signals. The reflection members 5 and 6, as stated above, amplify and reflect the sound signals back and forth along a tortuous path and finally into the trumpet 7 where they are further amplified and emitted through the front of the speaker.

The transducer 3 in FIG. 2 includes a permanent magnet 3A which forms a magnet field, and it also includes a diaphragm 3B which vibrates in the magnetic field in response to the application of audio signals to the speaker. As mentioned above, the vibration of the diaphragm 3B generates sound signals which are passed through the nozzle 4, and are then reflected back and forth by the reflection members 5 and 6 to be finally emitted through the trumpet 7 from the front of the speaker.

Although the prior art speaker of FIG. 2 is shorter than the prior art trumpet speaker of FIG. 1, it is still relatively large and heavy, and is generally unsuitable for most indoor installations.

Recently, speaker technology has been developed which utilizes piezo materials as oscillators in high power compact speakers. However, piezo materials may be used only at high frequencies and have poorer sound tones as compared with the prior art speakers of FIGS. 1 and 2. Moreover, the piezo-type speaker has a disadvantage in that it produces alarm signals only of a particular frequency, and it is not generally suitable for the reproduction of the human voice with any acceptable quality.

Figure 3:
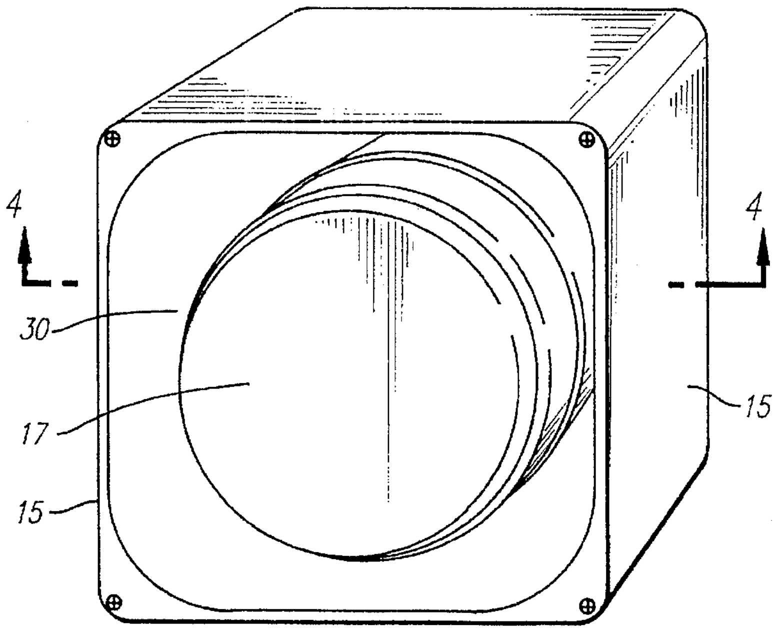
FIG. 3 is a front perspective view of an improved thin, compact high power speaker representing a first embodiment of the invention.
Figure 4:
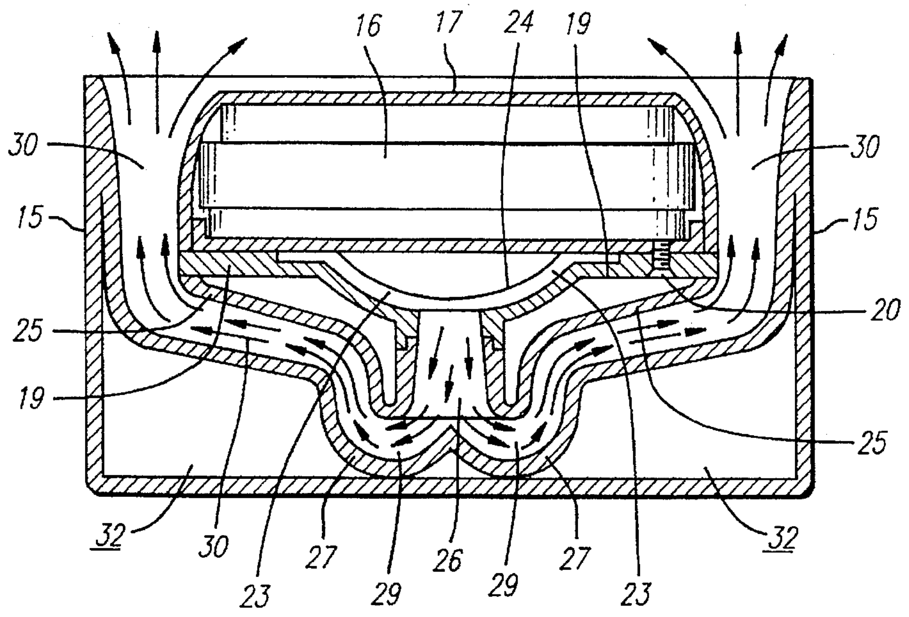
FIG. 4 is a section of the speaker of FIG. 3 taken substantially along the line 4—4 of FIG. 3.

The first and presently preferred embodiment of the invention is shown in FIGS. 3 and 4, and it constitutes a miniaturized, compact speaker which is housed in a relatively thin, rectangular housing 15 having an open front. In the first embodiments, a transducer 16 is contained in a housing 17 which is mounted adjacent to the open front of the housing 15, with the transducer facing the rear wall of housing 15 and spaced from the rear wall. A dish-shaped wall member 19 is secured to the front of housing 17 by screws, such as screw 20. Wall member 19 forms a chamber 23 for transducer diaphragm 24. Dish-shaped wall member 19 together with a further dish-shaped wall member 25 form a nozzle 26 extending out from chamber 23, the further member 25 being secured to member 19.

Yet another dish-shaped wall member 27 is secured to, or formed integral with, housing 15 in parallel and spaced relationship with wall member 25. The wall members 25 and 27 are shaped to have curvilinear inner surfaces, as shown, to define a resonance/reflection passage 29 which amplifies with the sound signals and reverses their direction and directs them into a foreshortened trumpet 30, the trumpet being formed by the periphery of transducer housing 17, and the member 27. Member 27 is formed to have a cusp-like configuration facing nozzle 26, smoothly to direct the high pressure sound signals from the nozzle into the resonance/reflection passage 29. Wall member 27 also forms a space 32 in the housing 15 for electronic circuitry used to drive the speaker.

Accordingly, when the transducer 16 in FIG. 3 is energized by electrical audio signals, diaphragm 24 vibrates, and the sound signals produced by the vibration of the diaphragm are concentrated and amplified in the high-pressure chamber 23 as an initial stage for the production of high volume sound signals by the speaker. The sound signals from chamber 23 are then passed through nozzle 26 into the resonance/reflection passage 29 where they are amplified, reversed in direction, and directed into trumpet 30 around the periphery of the housing 17 of transducer 16, to be further amplified and emitted through the front of the speaker.

The speaker shown in FIGS. 3 and 4 serves to amplify the output level of the sound signals and reverse the path of the sound signals through resonance path 29 into the shortened trumpet 30 to be radiated at high volume from the space around the periphery of transducer housing 17. The trumpet 30 is acoustically coupled to the sound resonance/reflection path 29, with the trumpet utilizing the space between housing 15 and the transducer housing 17 to accomplish its purpose. Accordingly, the trumpet 30 amplifies and emits sound signals after previous amplification in the path 29. In this manner, amplification and radiation of the sound signals are accomplished in the embodiment of FIGS. 3 and 4 with high efficiency and in a compact space. This feature enables the speaker of FIGS. 3 and 4 to be miniaturized as compared with the prior art speakers without any loss in the volume of the sound emitted by the speaker.

The path taken by the sound signals through the nozzle 16, through the path 29, and through the trumpet 30, is represented by the arrows in FIG. 4. As described above, the sound output from diaphragm 24 is pressurized in high-pressure chamber 23 and passed through nozzle 26, with amplification and the reflection of the sound signals occurring in the resonance/reflection path 29, and the final amplification and emission of the sound signals occurring through trumpet 30, as shown by the arrows.

Figure 5:
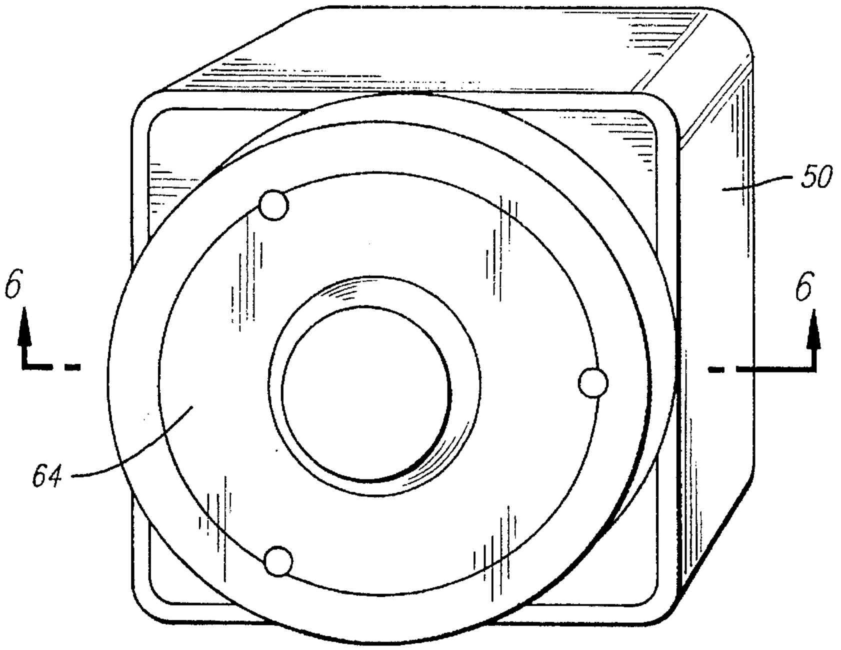
FIG. 5 is a front perspective view of a speaker representing a second embodiment of the invention.
Figure 6:
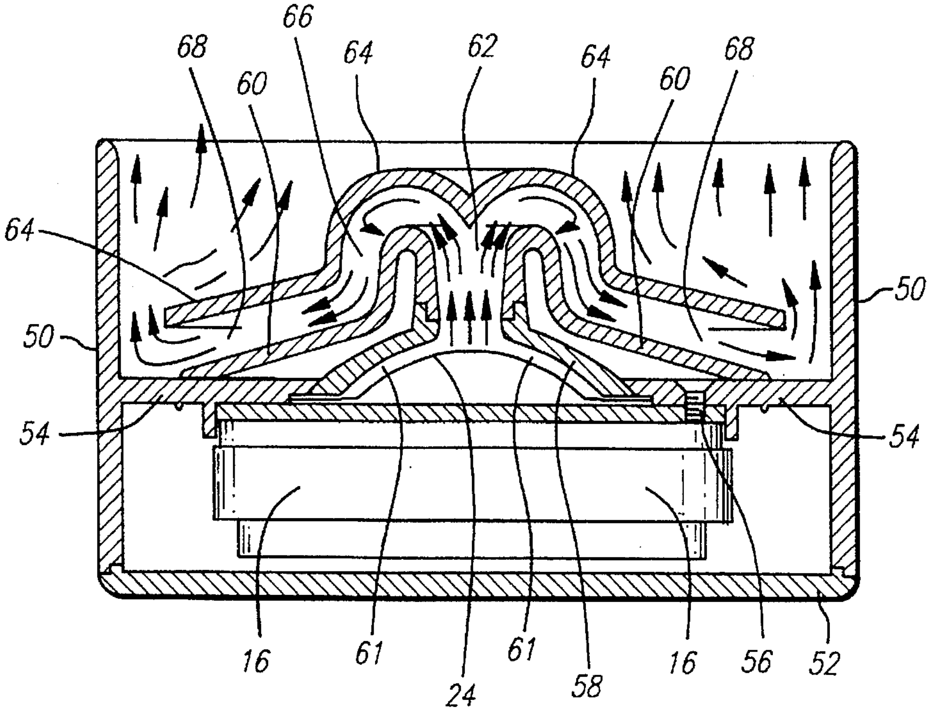
FIG. 6 is a section of the speaker of FIG. 5 taken substantially along the line 6—6.

The second embodiment of the invention is shown in FIGS. 5 and 6, and it includes a thin rectangular casing 50 having an open front and a closed bottom 52. An integral platform 54 is formed on the casing and extends across the interior of the casing parallel to the bottom 52. The platform has a central aperture, and the transducer 16 is mounted on the platform across the aperture by screws such as screw 56, with the transducer facing the open front of the case and spaced from the bottom 52.

The diaphragm 24 of the transducer extends through the central aperture of platform 54, and it is positioned in a pressure chamber formed by a hemispherical-shaped member 58 which is secured to the platform. The member 58, together with a dish-shaped wall member 60 forms a pressure nozzle 62. A second dish-shaped wall member 64 is mounted in the housing 50 in spaced relationship with the member 60 to form a sound resonance/reversing passage 66. As in the previous embodiment, the member 64 has a cusp-shaped portion facing the exit of the pressure nozzle 62 so that the pressurized sound from the pressure chamber 61 passing through the nozzle 62 is smoothly reflected and directed back toward the transducer and into a passage 68. Passage 68 terminates within the housing 50 spaced from the side of the housing so that the sound passes around the outer edge of member 64 and passes up the inner surface of the housing and out the open front of the housing, as represented by the arrows.

When transducer 16 is activated by electric audio signals, diaphragm 24 vibrates in pressure chamber 61, and the sound signals produced in the pressurized chamber constitute an initial step for the creation of high volume sound signals in the speaker. The signals in the pressure chamber 61 pass through nozzle 64 to the sound resonance/reflection passage 66 which is acoustically coupled to the exit end of the nozzle. The sound signals are amplified in path 66 and directed toward the entrance of path 68. The signals from path 68 are then directed to an end reflection path formed by the front portion of casing 50 surrounding the open front of the speaker. Path 68 introduces the sound signals to another round of amplification, and the end reflection path directs the sound signals from the induction path 68 into a wide space at the open end of the speaker. Thus amplification and radiation of the sound signals are accomplished.

The arrows in FIG. 6 depict the sound path in the speaker structure of the second embodiment. As described above, the arrows depict the output of the sound signals from diaphragm 24 into the high-pressure chamber 61 and through nozzle 62 to path 66. The sound signals are resonated and reflected in path 66, and directed to the sound induction path 68. The signals are then directed out from path 68 and reflected against the inner surface of casing 50 to be directed into the open space between the casing and the disc-shaped member 64.

In the case of the preferred embodiment of FIGS. 3 and 4, the speaker provides high quality sound signals over a broad frequency range, and that embodiment is suitable for the amplification and reproduction not only of alarm signals but also the human voice.

In the case of the second embodiment of FIGS. 5 and 6, the speaker has a slight frequency distortion in the sound signals since the length of the sound path is relatively shorter than that of the first embodiment. The end reflection surface of casing 50 in FIG. 6 adjacent its open end complements the shorter sound path. The second embodiment guarantees high power to the sound signals, and is suitable for providing a speaker unit for alarm systems.

Figure 7:
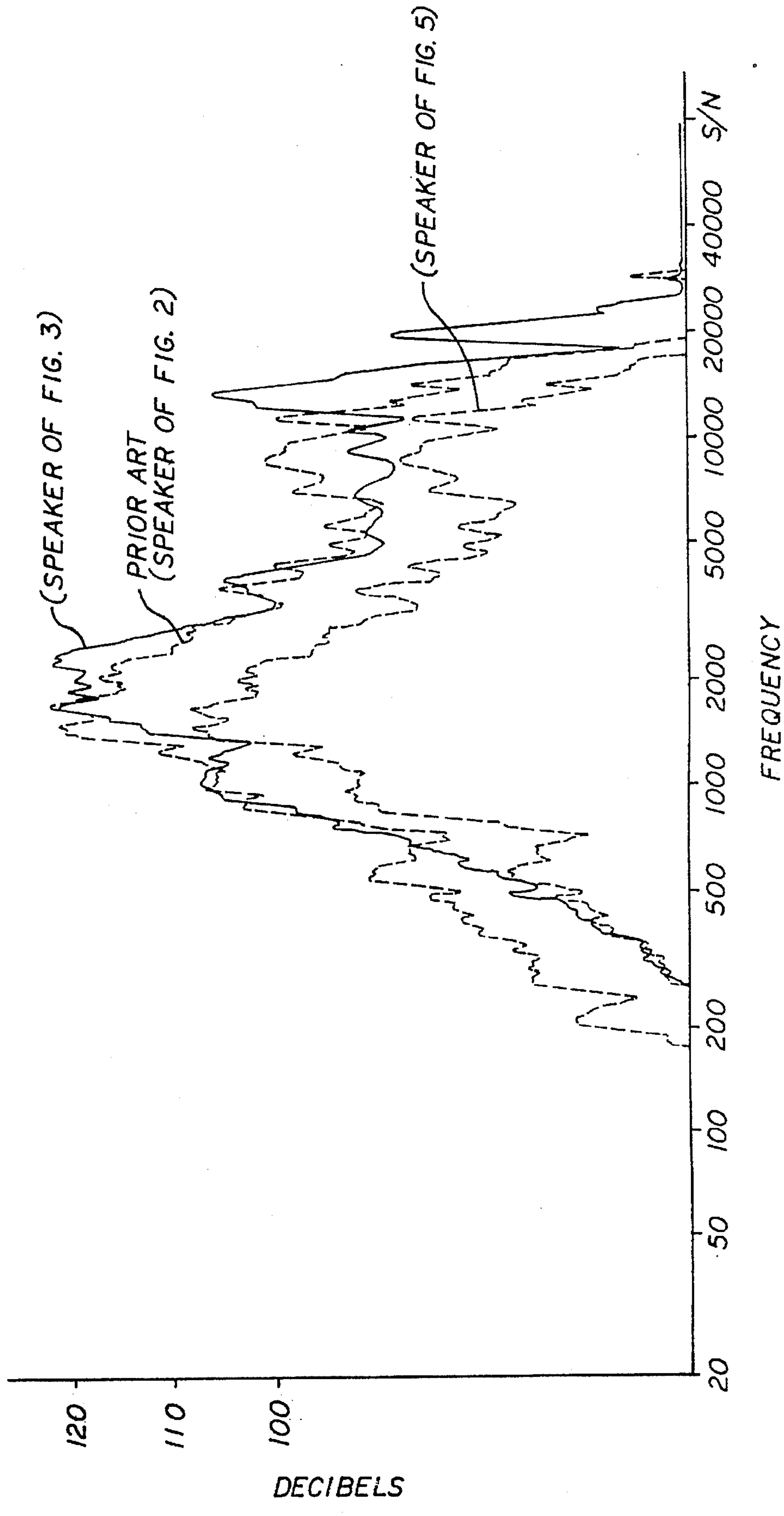
FIG. 7 is a series of graphs illustrating the response frequency characteristics of the speakers of the first and second embodiments of FIGS. 1 and 4 as compared with the prior art reflection speaker of FIG. 2.

FIG. 7 is a series of graphs depicting examples of the experimental frequency characteristics of the two embodiments of the invention described above, both constituting thin, compact, high power speaker units. The graphs clearly show the response characteristics of the first embodiment of FIG. 3, and of the second embodiment of FIG. 5, as compared with the response characteristics of the prior art speaker of FIG. 2.

The invention provides, therefore, a thin, compact, high power speaker unit which is small in size and light in weight, and which is capable of providing excellent broad-range frequency characteristics.

While particular embodiments of the invention have been shown and described, modifications may be made, and it is intended in the following claims to cover all such modifications which fall within the true spirit and scope of the invention.

I claim:

1. A speaker comprising: a housing having a closed end and an open end; a transducer mounted in said housing for producing sound signals in response to electrical audio signals applied thereto; a second housing surrounding said transducer; a first dish-shaped wall member attached to the exterior of said second housing having a central opening therein and forming a pressure chamber acoustically coupled to said transducer for receiving the sound signals from the transducer; a diaphragm for said transducer mounted in said pressure chamber; a second dish-shaped wall member attached to said first dish-shaped wall member having a central tubular portion surrounding said central opening in said first dish-shaped wall member and having a central tubular portion surrounding said central opening in said first dish-shaped wall member forming a nozzle having an inlet acoustically coupled to said pressure chamber and said nozzle further having an outlet; a third dish-shaped wall member mounted in said housing having a cusp-shaped central portion facing the outlet of said nozzle and spaced from said dish-shaped wall member to form a sound resonance/reflection passage acoustically coupled to the outlet of said nozzle and constructed to resonate with the sound signals from said nozzle and to change the direction thereof; and said third dish-shaped member being shaped to form a sound induction passage for said sound signals acoustically coupled to said sound resonance/reflection passage for directing the sound signals from said sound resonance/reflection passage through the open end of said housing.

2. The speaker defined in claim 1 in which said second housing surrounding said transducer has a disc-like configuration with a peripheral edge and is mounted adjacent to the open end of said housing and displaced radially inwardly from said housing, and said third dish-shaped member is attached to said housing and is radially spaced from the peripheral edge of said second housing to form an outlet passage, and said induction passage directs the sound signals around said peripheral edge of said second housing and into said outlet passage.

3. The speaker defined in claim 1, in which said transducer is mounted adjacent to but spaced from the closed end of said housing; and said induction passage directs said sound signals toward the inner surface of said housing for deflection to the open of said housing.

4. The speaker defined in claim 3, and which includes a transverse wall separating said housing into a closed compartment serving as said casing for said transducer, and an open compartment surrounding said sound induction passage, with the inner surface of the open compartment of said housing forming said sound induction passage.

* * * * *